United States Patent [19]

Latasiewicz et al.

[11] 4,063,788
[45] Dec. 20, 1977

[54] CHASSIS CAPTIVATION ARRANGEMENT FOR VIBRATION ATTENUATION

[75] Inventors: Leonard Latasiewicz, Hoffman Estates; Peter Franklin Stultz, Des Plaines, both of Ill.

[73] Assignee: Motorola, Inc., Schaumburg, Ill.

[21] Appl. No.: 698,379

[22] Filed: June 21, 1976

[51] Int. Cl.² .................. A47B 81/06; H05K 5/02
[52] U.S. Cl. ........................... 312/7 R; 325/352; 361/395; 361/399
[58] Field of Search ............ 312/7 R; 325/119, 312, 325/352, 353, 361; 317/101 DM, 101 C, 101 R; D56/4 B

[56] References Cited

U.S. PATENT DOCUMENTS

| | | | |
|---|---|---|---|
| 2,501,689 | 3/1950 | Peterson | 312/7 R |
| 2,717,818 | 9/1955 | Bond | 325/353 |
| 3,391,754 | 7/1968 | Montanaro | 325/352 |
| 3,422,358 | 1/1969 | Sabonis | 325/353 |
| 3,595,337 | 7/1971 | Furey | 312/7 R |
| 3,631,299 | 12/1971 | Meyer | 317/101 DM |
| 3,639,808 | 2/1972 | Phlieger, Jr. | 317/101 DM |
| 3,723,823 | 3/1973 | Lit et al. | 317/101 DM |
| 3,909,679 | 9/1975 | Petri | 325/352 |

*Primary Examiner*—Paul R. Gilliam
*Assistant Examiner*—Alexander Grosz
*Attorney, Agent, or Firm*—Margaret Marsh Parker; James W. Gillman

[57] ABSTRACT

A chassis for supporting a printed circuit board and other components is captivated between two plastic housing portions in a suspension mode. The housing provides support for the entire unit, there being no direct support to the chassis or printed circuit board or associated components. The chassis is formed with projecting tabs which are captivated between bosses formed on the upper and lower parts of the housing. A screw penetrates the boss of the upper portion and the chassis tab, then threads into the boss of the lower portion. Wedge bosses formed in the back walls of the housing bias the chassis into alignment with the rear of the housing when the housing parts meet and provide support to the chassis when interconnecting cables are attached. No individual components, other than the speaker, are fixed to either housing part.

5 Claims, 3 Drawing Figures

U.S. Patent    Dec. 20, 1977    4,063,788

CHASSIS CAPTIVATION ARRANGEMENT FOR VIBRATION ATTENUATION

BACKGROUND OF THE INVENTION

This invention relates to the field of chassis mounting in electronic apparatus and particularly to mounting for vibration attenuation in a vehicle.

Electronic apparatus, and particularly that type designed to be mounted in vehicles, is subject to damage from vibration. Since the printed circuit board and its associated components represent almost all of the vulnerable points of such equipment, the attenuation of vibration before it reaches the board is of the utmost importance in such installations. Prior art practice has been to mount a printed circuit board on a chassis which is rigidly supported in a vehicle by direct support devices with the housing being merely attached to the chassis. In the many variations of this type of mounting, a direct line for vibration exists between the chassis and the vehicle itself so that road vibrations are transferred directly to the printed circuit board and its associated components. This constant vibration can cause failure to the unit after a period of time.

SUMMARY OF THE INVENTION

It is therefore an object of this invention to provide increased vibration attenuation for a unit of electronic equipment to be mounted in a vehicle.

This objective is achieved in a unit constructed in accordance with the invention by providing a two-part plastic housing in which the printed circuit board and attached chassis are suspended by means of chassis mounting tabs which project laterally from the chassis and are captivated between bosses formed on each of the housing parts, so that vibration is attenuated before reaching the printed circuit board and its associated components. All manual controls are mounted on the chassis and are accessible through appropriately shaped and positioned apertures in the housing. Flexible cables are connected to the chassis through openings in the rear wall of the housing, and small, integrally formed wedges captivate the back edges of the chassis to prevent motion of the chassis when cables are attached or removed.

The entire apparatus is mounted by attaching the housing to a support structure by means which are the subject of a co-pending application, "Ser. No. 698,377, now U.S. Pat. No. 4,032,204", filed as of even date with the present application, by a different applicant, and assigned to the same assignee as the present invention.

DETAILED DESCRIPTION OF A PREFERRED EMBODIMENT

Figure 1:
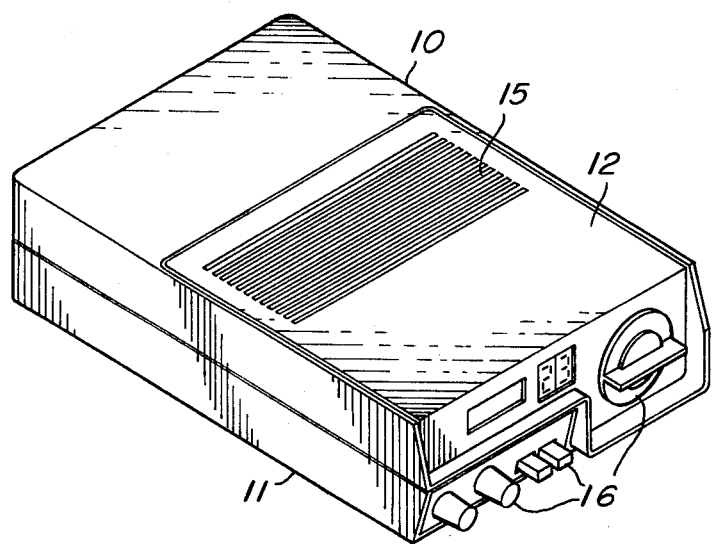
FIG. 1 is an overall perspective view of an electronic apparatus such as would utilize the invention.

Referring now more particularly to the drawing, FIG. 1 is an example of an electronic apparatus, embodying the invention and suggesting the clean appearance of the assembled apparatus. Mounting in the vehicle is by way of a separate device which attaches only to the housing and is disclosed in the co-pending application referred to hereinabove.

Figure 3:
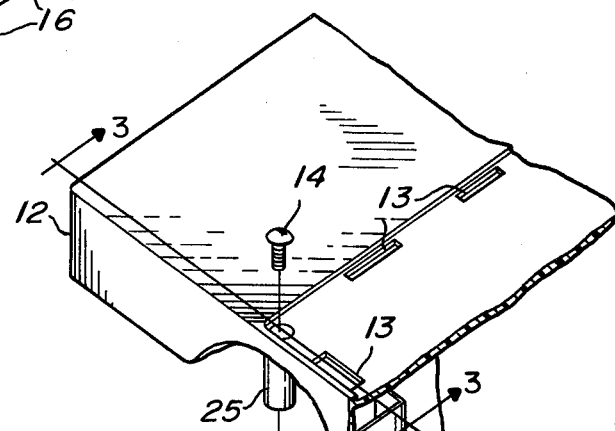
FIG. 3 is a cross-section taken along the line 3—3 of FIG. 2.
Figure 3:
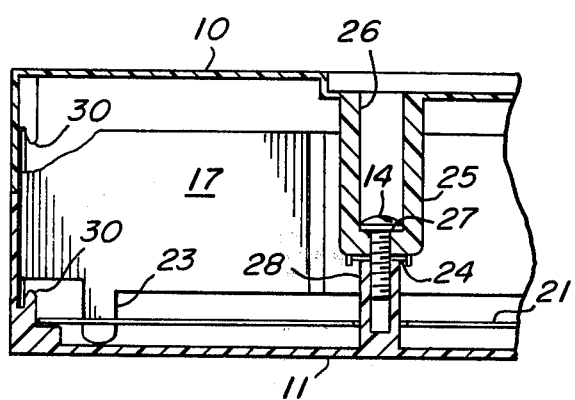
Figure 2:
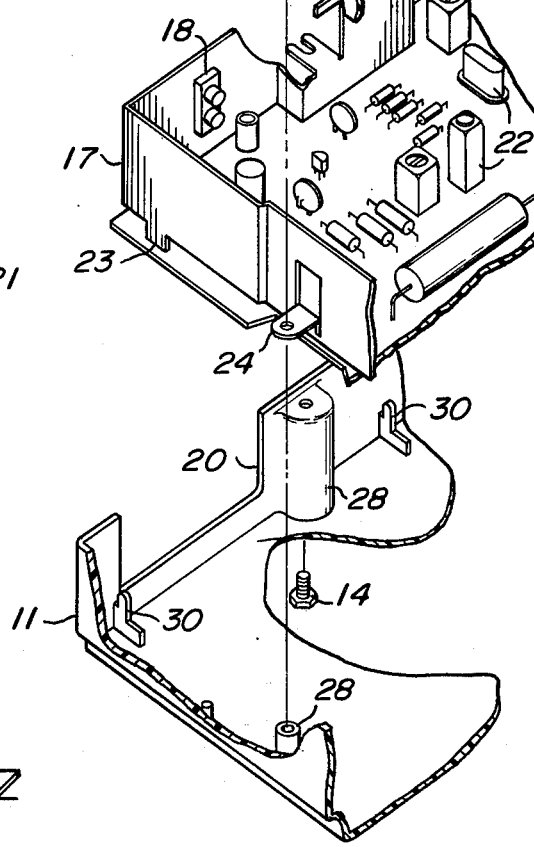
FIG. 2 is an exploded perspective view of a portion of the apparatus of FIG. 1, embodying the invention.

The housing comprises a first portion 10 and a second portion 11. The first portion has clipped to the outer surface thereof a third portion 12 which attaches by means of apertures 13 (FIG. 2). This third portion 12 covers most or all of the housing fastener screws 14 (FIGS. 2 and 3) and also includes a grille 15 for protecting an underlying loudspeaker (not shown). Various controls and displays, designated generally as numeral 16 are completely supported by a chassis 17 (FIGS. 2 and 3). The controls 16 project or are visible through openings in the housing portions 10 and 11. Various electrical connectors 18 (one shown) mount on the rear of the chassis 17 and are accessed through an opening 20 (partially shown) in the housing. Thus, no mechanical connection exists between components in the chassis 17 and the housing portions 10 and 11.

As shown in FIGS. 2 and 3, there is mounted on the chassis 17 a printed circuit board 21 (partially shown) and numerous associated components 22. The printed circuit board 21 is fastened electrically and mechanically to the chassis by means of a number of tabs 23 which project from the lower edge of the chassis wall. Neither the printed circuit board 21 nor the tabs 23 contact the housing. Also integrally formed with the chassis 17 are at least four mounting tabs 24 which projects laterally from the sides of the chassis 17 and have apertures or slots for receiving the screws 14. The tabs 24 support the chassis in a suspension mode as will be described hereinafter. The top portion 10 of the housing is formed with at least four integral bosses 25 which include wells for receiving the housing fastener screws 14. Each well has a through bore 26 which allows the screw head to drop below the outer surface of the top housing portion 10. The screw head is retained in the well of the boss 25 by a constricted or neck portion 27.

The lower portion 11 of the housing is formed with at least four integral bosses 28, disposed for alignment with the bosses 25 and the chassis tabs 24 when the chassis 17 is captivated by the housing portions 10 and 11. The bosses 28 are dimensioned to be threaded into by the threads of the fastener screws 14. Adjacent the rear walls of the housing portions 10 and 11 are a number of integrally formed wedge-shaped bosses 30, the function of which will be explained hereinafter.

In the assembly of the apparatus, the components 22 associated with the printed circuit board 21 are put into place, the chassis 17 is attached mechanically by means of the tabs 23 to the printed circuit board 21, interconnection between the board 21 and the chassis 17 are made and the combined unit is soldered. The chassis 17 is then placed in the housing bottom portion 11 with the tabs 24 resting on the bosses 28. As the chassis 17 is put into place, the lower edge of the rear wall of the chassis is engaged by the wedge bosses 30 of the housing portion 10 and thereby biased toward the rear wall of the housing. The top portion 10 of the housing is then placed over the combined chassis 17 and housing portion 11, with the wedge bosses 30 of the portion 10 engaging the top edge of the rear wall of the chassis 17. The biasing action of the wedge bosses 30 is to provide support when the cables (not shown) are attached to cable sockets 18 (one shown). The bosses 25 of the housing portion 10 are then in contact and alignment with the chassis tabs 24, allowing the threaded portion of the screws 14 to pass through the bosses 25, the tabs 24, and into the bosses 28.

Thus, the entire chassis-and-board unit is suspended by the tabs 24 within the complete housing. Since mounting of the entire apparatus in the vehicle is accomplished by means attached only to the housing, vehicle vibration is considerably attenuated by passing from the mounting means through the plastic housing portions 10 and 11 and the bosses 25 and 28, the tabs 24 of the chassis 17 and the body of the chassis before reaching the printed circuit board and its components.

It will be appreciated that many modifications and variations of the principle of vibration attenuation as disclosed herein are possible, such as reversing the bosses 25 and 28 or a number thereof in the housing portions 10 and 11. Also, the two functions of captivating the chassis and fastening the housing portions together might be separated with another type of integrally formed, mating members used for captivating the chassis tabs between the housing portions and with the screws or other form of housing fasteners located in a different location. It is intended to cover these and all other such variations as fall within the spirit and scope of the appended claims.

What is claimed is:

1. A chassis captivation arrangement for electronic apparatus including in combination:
   a chassis for supporting at least an insulating circuit board and associated components, the chassis comprising laterally projecting tab means;
   first and second separable housing portions, each housing portion comprising integrally formed members in alignment with the tab means for captivating each said tab means between two of the integrally formed members of the respective housing portions when the housing portions are joined;
   whereby said tab means form the sole support for the chassis, the insulated circuit board and the associated components, so that vibration is attenuated before reaching the insulated circuit board and its associated components, so that vibration is attenuated before reaching the insulated circuit board and its associated components.

2. A chassis captivation arrangement according to claim 1 wherein the electronic apparatus further includes controls and wherein at least one of said housing portions includes apertures for allowing access to certain ones of said controls.

3. A chassis captivation arrangement according to claim 1 wherein at least one of the housing portions further includes integrally formed wedge means for captivating a chassis edge whereby inward motion of the chassis edge is prevented after the first and second housing portions are joined.

4. A chassis captivation arrangement according to claim 1 wherein the electronic apparatus further includes a loudspeaker and a cover for said loudspeaker and wherein the first housing portion further includes means for attaching the loudspeaker cover for protecting said loudspeaker and for concealing the through bores of said housing portion.

5. A chassis captivating arrangement for electronic apparatus including in combination:
   a plurality of fastener means each having a head and a threaded body portion;
   metal chassis means for supporting at least an insulated circuit board, the chassis having laterally projecting tab portions with apertures therein for admitting the body portion of the fastener means;
   resilient plastic housing means comprising first and second separable portions, said first housing portion having a plurality of bosses integrally formed therewith, each said first housing portion boss having a through bore adapted to pass the threaded body portion of the fastening means while retaining the head portion, said second housing portion having bosses with apertures adapted to threadably receive the body portion of the fastener means, said chassis tab apertures, first housing portion boss through bores and the second housing portion boss apertures being aligned in registry, whereby the chassis is supported in suspension within the housing by the captivation of the chassis tabs between the bosses of the housing portions when the housing portions are joined by the fastener means.

* * * * *